(12) United States Patent
Bakr et al.

(10) Patent No.: US 10,767,110 B2
(45) Date of Patent: Sep. 8, 2020

(54) SYSTEM AND METHOD FOR MAKING QUANTUM DOTS

(71) Applicant: King Abdullah University of Science and Technology, Thuwal (SA)

(72) Inventors: Osman M. Bakr, Thuwal (SA); Jun Pan, Thuwal (SA); Ala'a El-Ballouli, Thuwal (SA); Kristian Rahbek Knudsen, Thuwal (SA); Ahmed L. Abdelhady, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 284 days.

(21) Appl. No.: 15/966,078

(22) Filed: Apr. 30, 2018

(65) Prior Publication Data

US 2018/0312753 A1    Nov. 1, 2018

Related U.S. Application Data

(62) Division of application No. 15/025,918, filed as application No. PCT/IB2014/003155 on Oct. 3, 2014, now Pat. No. 10,301,543.

(60) Provisional application No. 62/024,490, filed on Jul. 15, 2014, provisional application No. 61/890,536, filed on Oct. 14, 2013, provisional application No. 61/886,837, filed on Oct. 4, 2013.

(51) Int. Cl.
| | |
|---|---|
| *C09K 11/00* | (2006.01) |
| *B01J 13/00* | (2006.01) |
| *C09K 11/66* | (2006.01) |
| *H01L 21/02* | (2006.01) |
| *B01J 19/00* | (2006.01) |
| *C09K 11/54* | (2006.01) |
| *C09K 11/58* | (2006.01) |
| *B01J 14/00* | (2006.01) |
| *C01G 15/00* | (2006.01) |
| *C01G 21/21* | (2006.01) |
| *C01G 51/00* | (2006.01) |
| *C09K 11/02* | (2006.01) |
| *H01L 31/0352* | (2006.01) |
| *H01L 33/04* | (2010.01) |
| *B82Y 30/00* | (2011.01) |
| *B82Y 20/00* | (2011.01) |
| *B82Y 35/00* | (2011.01) |

(52) U.S. Cl.
CPC ............. *C09K 11/661* (2013.01); *B01J 13/00* (2013.01); *B01J 14/00* (2013.01); *B01J 19/0093* (2013.01); *C01G 15/006* (2013.01); *C01G 21/21* (2013.01); *C01G 51/30* (2013.01); *C09K 11/025* (2013.01); *C09K 11/54* (2013.01); *C09K 11/582* (2013.01); *H01L 21/02568* (2013.01); *H01L 21/02601* (2013.01); *H01L 21/02628* (2013.01); *H01L 31/035218* (2013.01); *H01L 33/04* (2013.01); *B01J 2219/0086* (2013.01); *B01J 2219/00792* (2013.01); *B01J 2219/00795* (2013.01); *B01J 2219/00833* (2013.01); *B01J 2219/00873* (2013.01); *B01J 2219/00889* (2013.01); *B82Y 20/00* (2013.01); *B82Y 30/00* (2013.01); *B82Y 35/00* (2013.01); *Y10S 977/774* (2013.01); *Y10S 977/896* (2013.01); *Y10S 977/95* (2013.01)

(58) Field of Classification Search
CPC .. B01J 13/00; B01J 2219/00792; B01J 14/00; B01J 19/0093; B01J 2219/00795; B01J 2219/00833; B01J 2219/0086; B01J 2219/00873; B01J 2219/00889; C09K 11/661; C09K 11/025; C09K 11/54; C09K 11/582; C01G 15/006; C01G 21/21; C01G 51/30; H01L 21/02568; H01L 21/02601; H01L 21/02628; H01L 31/035218; H01L 33/04; B82Y 20/00; B82Y 30/00; B82Y 35/00; Y10S 977/774; Y10S 977/896; Y10S 977/95

See application file for complete search history.

(56) References Cited

U.S. PATENT DOCUMENTS

| | | | |
|---|---|---|---|
| 5,976,398 A | 11/1999 | Yagi | |
| 7,575,699 B2* | 8/2009 | Strouse | C01G 55/00 264/5 |
| 2002/0083888 A1* | 7/2002 | Zehnder | B82Y 10/00 117/69 |

(Continued)

FOREIGN PATENT DOCUMENTS

| | | |
|---|---|---|
| GB | 2457314 | 8/2009 |
| JP | 2001302399 A | 10/2001 |

(Continued)

OTHER PUBLICATIONS

Notification of Transmittal of the International Search Report and the Written Opinion of the International Opinion of the International Searching Authority, or the Declaration for PCT/IB2014/003155 dated Jun. 11, 2015.

(Continued)

*Primary Examiner* — Anshu Bhatia
(74) *Attorney, Agent, or Firm* — Billion & Armitage; Lisbeth C. Robinson

(57) ABSTRACT

Embodiments of the present disclosure provide for methods of making quantum dots (QDs) (passivated or unpassivated) using a continuous flow process, systems for making QDs using a continuous flow process, and the like. In one or more embodiments, the QDs produced using embodiments of the present disclosure can be used in solar photovoltaic cells, bio-imaging, IR emitters, or LEDs.

20 Claims, 9 Drawing Sheets

(56) References Cited

U.S. PATENT DOCUMENTS

| | | | |
|---|---|---|---|
| 2007/0020400 | A1 | 1/2007 | Chang |
| 2010/0311229 | A1 | 12/2010 | Einav |
| 2011/0303269 | A1 | 12/2011 | Kim et al. |
| 2013/0259808 | A1 | 10/2013 | Chen |

FOREIGN PATENT DOCUMENTS

| | | | |
|---|---|---|---|
| JP | 2006513450 | A | 4/2006 |
| JP | 2006513458 | A | 4/2006 |
| JP | 2007069162 | A | 3/2007 |
| JP | 2009513018 | A | 3/2009 |
| JP | 2010502559 | A | 1/2010 |
| JP | 2010513032 | A | 4/2010 |
| JP | 2011051821 | A | 3/2011 |
| JP | 2011514242 | A | 5/2011 |
| JP | 2011522787 | A | 8/2011 |
| JP | 2013524530 | A | 6/2013 |
| JP | 2013149729 | A | 8/2013 |

OTHER PUBLICATIONS

Frenz, et al., "Droplet-Based Microreactors for the Synthesis of Magnetic Iron Oxide Nanoparticle", Angewandte Chemie, Wiley, (document presenting well-known technique; newly cited reference), 2008, 6817-6820.

Kumar, "Microfluidic Synthesis of superparamagnetic Irton Oxide Nanocrystal for Magnetic Resonance Image", Submitted for the degree of Doctor of Philosophy, Imperil [sic] College London Univeristy, Aug. 2013.

Nightingale, et al., "Development of a Varsatile [sic], Stab le Droplet-reactor for High Temperature Nanocrystal Synthesis", submitted for the degree of Doctor of Philospshy, Imperial College London, Oct. 2010.

Yang, et al., "Continuous synthesis of Full-Color Emitting core/Shell quantum Dots via Microreaction", Crystal Growth & Design Article, American Chemical Society vol. 9, Sep. 18, 2009, 4807-4813.

"3M Fluorinert Electronic Liquid FC-70", Product information, 2000, 4.

Abdelhady, et al., "Flow reactor synthesis of CdSe, CdS, Cdse/Cds and CdSeS nanoparticles from single molecular precursor(s)", Journal of Chemistry, The Royal Society of Chemistry, 2011, 18768-18775.

Abou-Hassan, et al., "Synthesis of cobalt ferrite nanoparticles in continuous-flow microreactors", RSC Advances, 2012, 11263-11266.

Abou-Hassan, et al., "Synthesis of goethite by separation of the nucleation and growth processes of ferrihydrite nanoparticles using microfluidics", Angew. Chem., 2009, 2378-2381.

Boleininger, et al., "Microfluidic continuous flow synthesis of rod-shaped gold and silver nanocrystals", Physical Chemistry Chemical Physics, 2006, 3824-3827.

Burlakov, et al., "Ostwald ripening of binary alloy particles", The Journal of Chemical Physics 134, 2011, 8.

Carey, et al., "Colloidal quantum Dot Solar Cells", Chemical Reviews, 2015, 12732-127638.

Chan, et al., "High-Temperature Microfluidic Synthesis of CdSe Nanocrystals in Nanoliter Droplets", JACS Articles, Sep. 21, 2005, 13854-13861.

Chan, et al., "Size-controlled growth of CdSe nanocrystals in microfluidic reactors", Nano Letters, American Chemical Society, 2003, 199-201.

Cottam, et al., "Accelerated synthesis of titanium oxide nanostructures using microfluidic chips", Lab on a Chip, 2006, 167-169.

Debnath, et al., "Solution-processed colloidal quantum dot photovoltaics: A perspective", Energy & Environmental Science, 2011, 4870-4881.

Edel, et al., "Microfluidic routes to the controlled production of nanoparticles", Chem. Commun., 2002, 1136-1137.

Ford, et al., "Earth Abundant Element Cu2Zn(Sn1-xGex)S4 Nanocrystals for Tunable Band Gap Solar Cells: 6.8% Efficient Device Fabrication", Chemistry Materials, 2011; 2626-2629.

Guo, et al., "Fabrication of 7.2% Efficient CZTSSe Solar Cells Using CZTS Nanocrystals", J. Am. Chem. Soc., 2010, 17384-17386.

Guo, et al., "Ink formulation and low-temperature incorporation of sodium to yield 12% efficient Cu(In,Ga)(S,Se)2 solar cells from sulfide nanocrystal inks", Progress Photovoltaics, Research Articles, 2013, 64-71.

Hassan, et al., "Continuous Multistep Microfluidic Assisted Assembly of Fluorescent, Plasmonic, and Magnetic Nanostructures", Angewandte Communications, Microfluidic Assembly, 2013, 1994-1997.

Hines, et al., "Colloidal PbS nanocrystals with size-tunable near-infrared emission: Observation of post-synthesis self-narrowing of the particle size distribution", Advanced Materials, 2003, 1844-1849.

Hyuang, et al., "Continuous synthesis of SnTe nanorods", Journal of Material Chemistry, the Royal Society of Chemistry, May 18, 2011.

Ip, et al., "Hybrid Passivated Colloidal Quantum Dot Solids", Nature Nanotechnology, 2012, 577-582.

Jahn, et al., "Preparation of nanoparticles by continuous-flow microfluidics", J. Nanopart Res., 2008, 925-934.

Khan, et al., "Microfluidic Synthesis of Colloidal Silica", Langmuir, 2004, 8604-8611.

Krishnadasan, et al., "On-line analysis of CdSe nanoparticle formation in a continuous flow chip-based microreactor", Journal of Materials Chemistry, 2004, 2655-2660.

Kroon, et al., "Accurate efficiency determination and stability studies of conjugated polymer/fullerene solar cells", Thin Solid Films, 2002, 223-228.

Lan, et al., "Self-Assembled, Nanowire Network Electrodes for Depleted Bulk Heterojunction Solar Cells", Advanced Materials, 2013, 1769-1773.

Marre, et al., "Synthesis of micro and nanostructures in microfluidic systems", Chemical Society Reviews, 2010, 1183-1202.

Mitzi, et al., "Hydrazine-based deposition route for device-quality CIGS films", Thin Solid Films, 2009, 2156-2162.

Moreels, et al., "Size-Tunable, Bright, and Stable PbS Quantum Dots: A Surface Chemistry Study", ACS Nano, 2011, 2004-2012.

Nightingale, et al., "Microscale synthesis of quantum dots", Journal of Materials Chemistry, May 21, 2010, 8454-8463.

Nightingale, et al., "Segmented Flow Reactors for Nanocrystal Synthesis", Advanced Materials, 2012, 1813-1821.

Nightingle, "Controlled Synthesis of III-V Quantym Dots in Microfluidic Reactors", ChemPhysChem, 2009, 2612-2614.

Ning, et al., "Graded Doping for Enhanced Colloidal Quantum Dot Photovoltaics", Advanced Materials, 2013, 1719-1723.

Pattantyus-Abraham, et al., "Depleted-Heterojunction Colloidal Quantum Dot Solar Cells", ACS Nano, American Chemical Society, 2010, 3374-3380.

Shestopalov, et al., "Multi-step synthesis of nanoparticles performed on millisecond time scale in a microfluidic droplet-based system", Lab Chip, 2004, 316-321.

Snaith, "The perils of solar cell efficiency measurements", Nature Photonics, vol. 6, Jun. 2012, 337-340.

Song, et al., "Investigations into Sulfobetaine-Stabilized Cu Nanoparticle Formation: Toward Development of a Microfluidic Synthesis", J. Phys. Chem., 2005, 9330-9338.

Song, et al., "Microfluidic Synthesis of Cobalt Nanoparticles", Chem. Mater., 2006, 2817-2827.

Song, et al., "Synthesis of palladium nanoparticles using a continuous flow polymeric microreactor", Journal Nanoscience Nanotechnology, 2004, 788-793.

Talapin, et al., "Prospects of Colloidal Nanocrystals for Electronic and Optoelectronic Applications", Chem. Rev., 2010, 389-458.

Wacker, et al., "Controlled synthesis of fluorescent silica nanoparticles inside microfluidic droplets", Lab Chip, 2012, 3111-3116.

Wagner, et al., "Continuous Synthesis of Gold Nanoparticles in a Microreactor", Nano Letters, 2005, 685-691.

(56) References Cited

OTHER PUBLICATIONS

Wen-Bin, et al., "Biomedical microdevices synthesis of iron oxide nanoparticles using a microfluidic system", Biomed Microdevices, Springer, 2009, 11.

Yang, et al., "Synthesis of nanocrystais via microreaction with temperature gradient: towards separation of nucleation and growth", Lab on a Chip, 2008, 451-455.

Yen, et al., "A continuous-flow microcapillary reactor for the preparation of a size series of CdSe nanocrystals", Advanced Materials, 2003, 1858-1662.

Yen, et al., "A Microfabricated gas-liquid segmented flow reactor for high-temperature synthesis: The case of CdSe quantum dots", Angewandte Chemie, 2005, 5447-5451.

\* cited by examiner

FIG. 1.1A PRIOR ART    Conventional Batch Synthesis
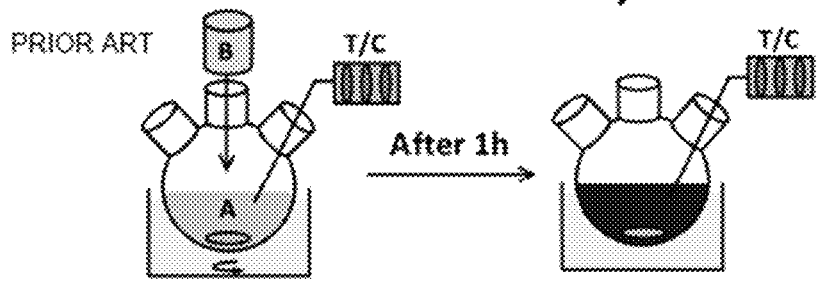
FIG. 1.1B    Dual-Stage Flow Reactor Synthesis
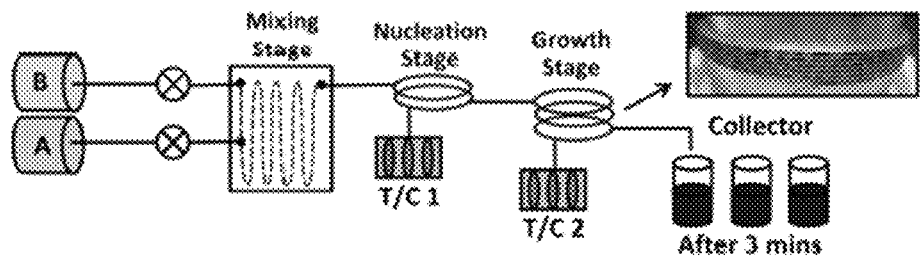
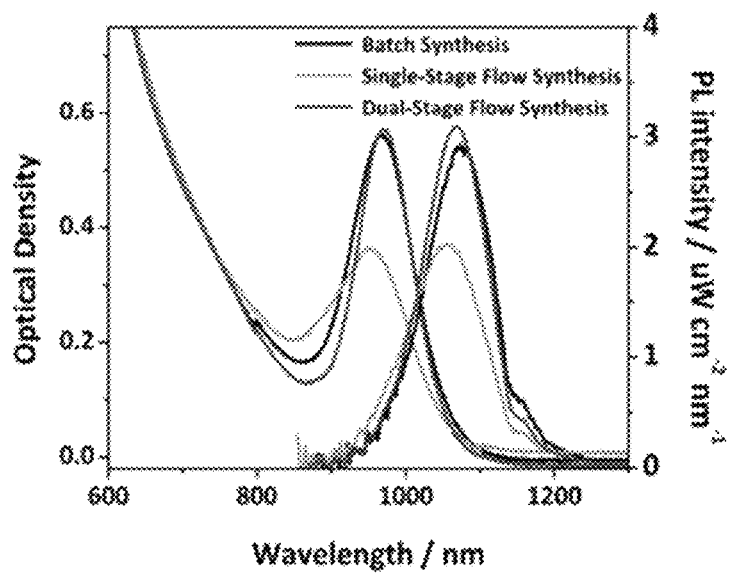
Figure 1.2

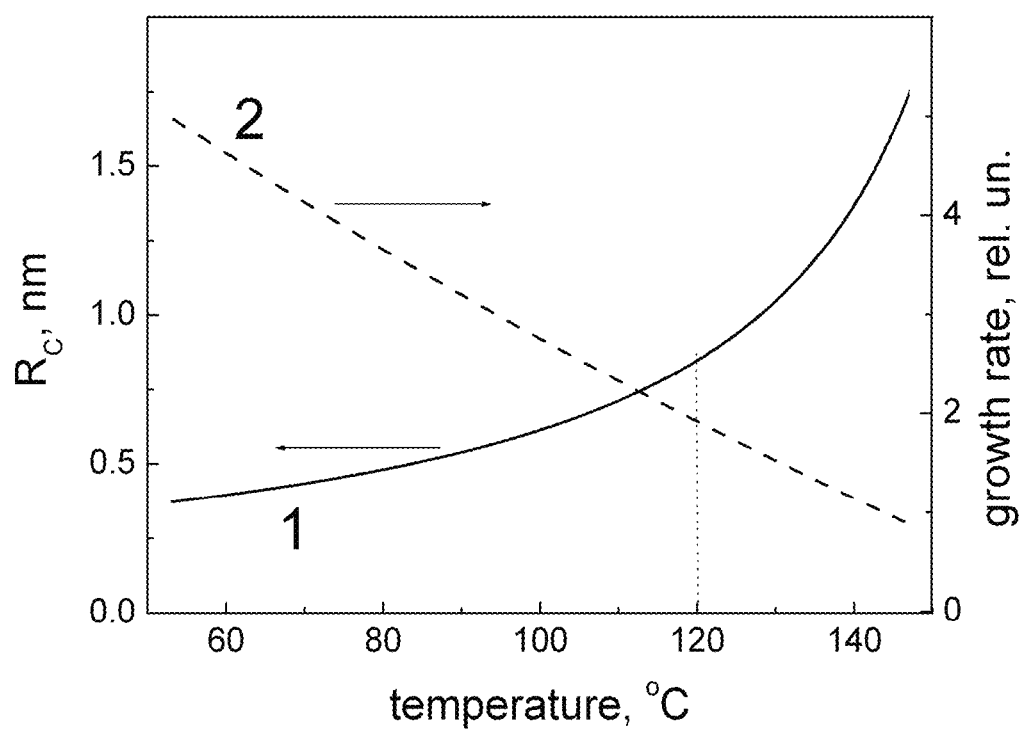
Figure 1.3

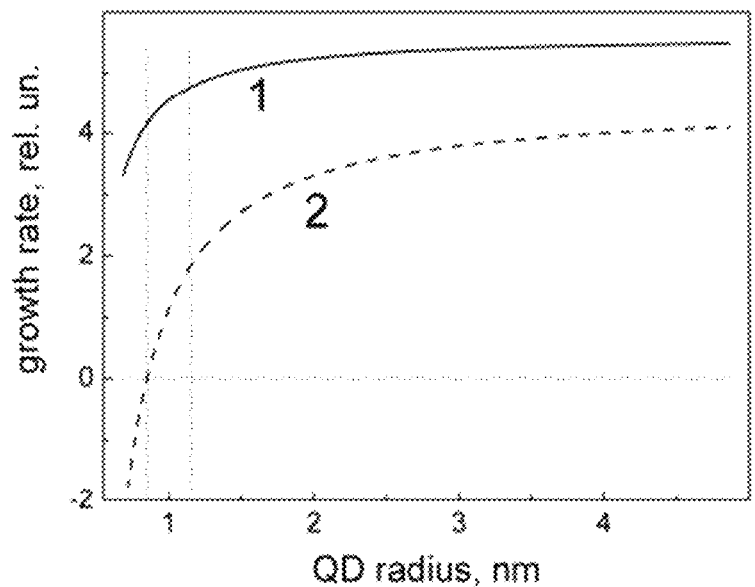
Figure 1.4
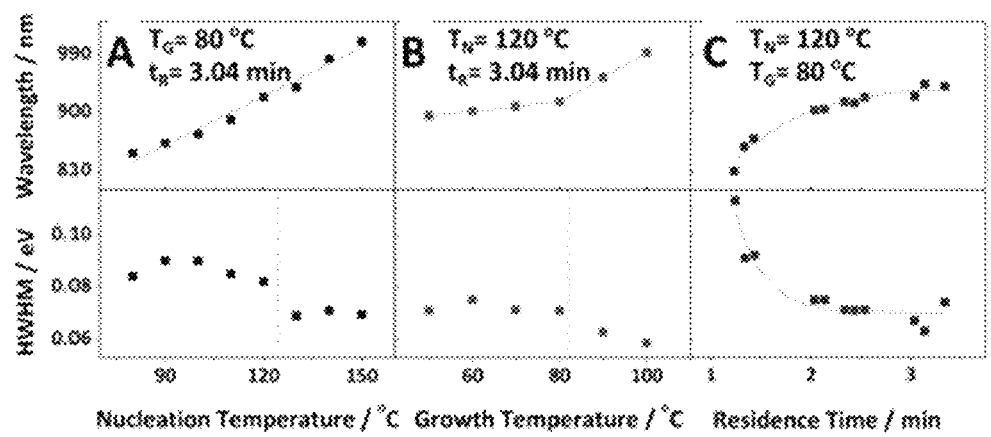
FIG. 1.5A  FIG. 1.5B  FIG. 1.5C

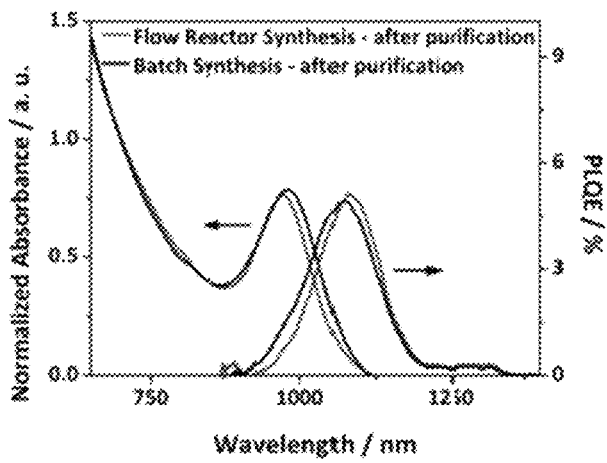
FIG. 1.6A
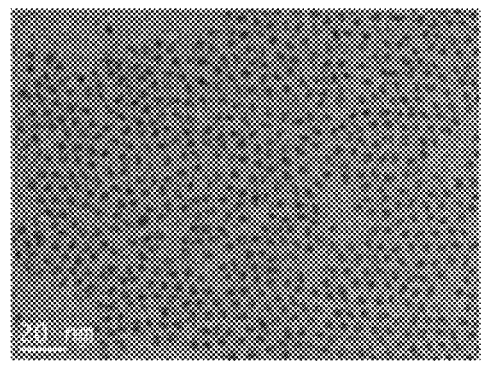
FIG. 1.6B
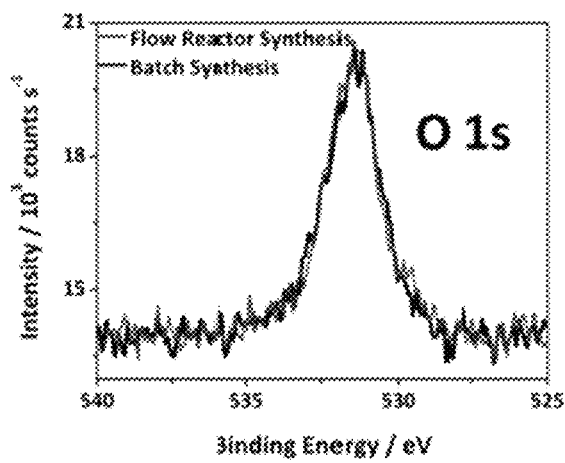
FIG. 1.6C
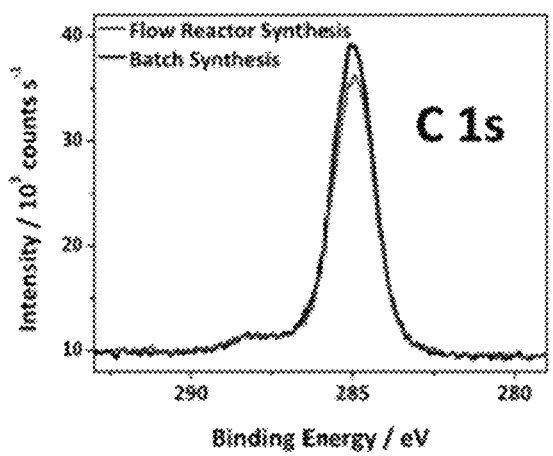
FIG. 1.6D

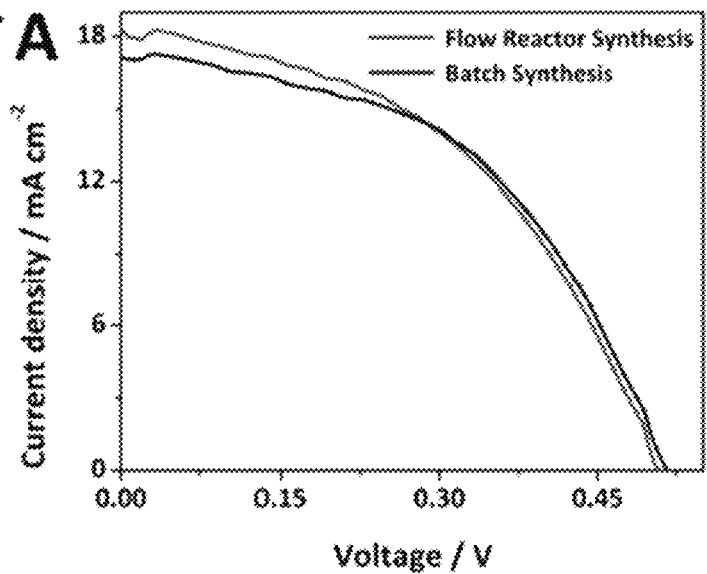
FIG. 1.7A
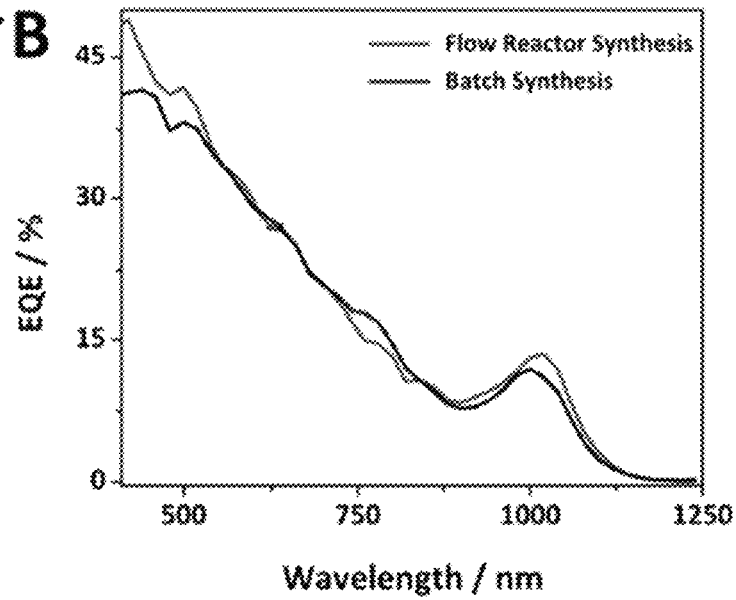
FIG. 1.7B

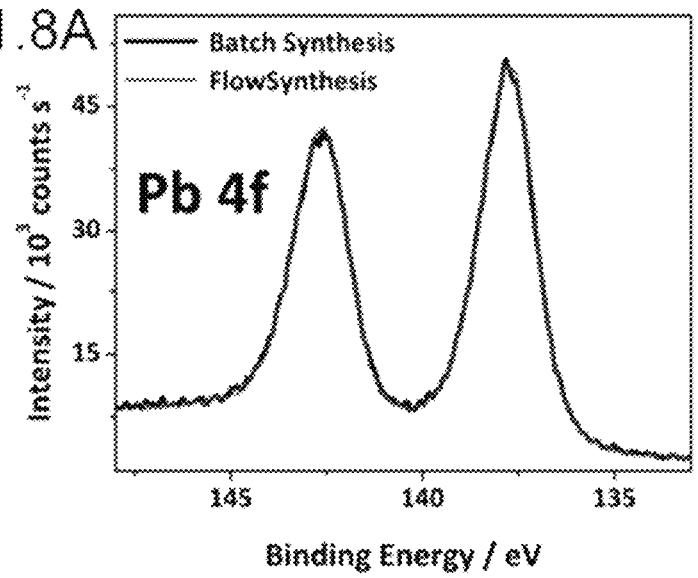
FIG. 1.8A
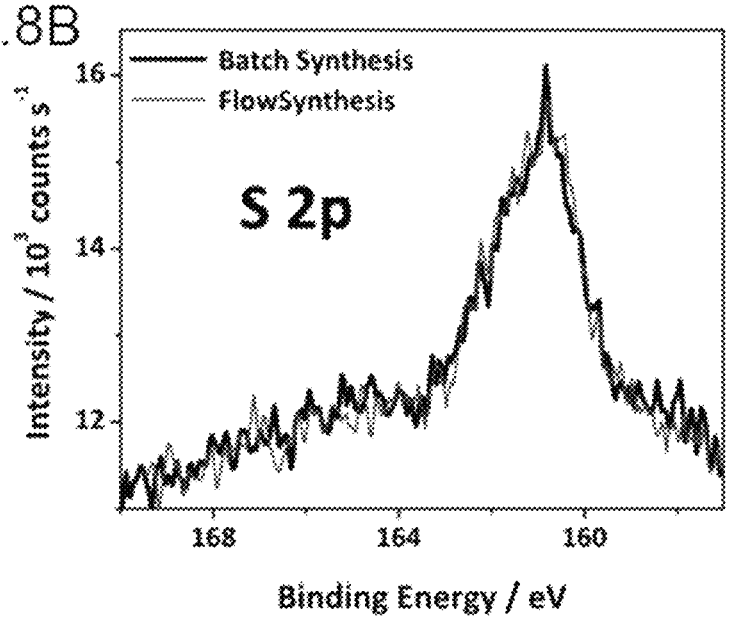
FIG. 1.8B

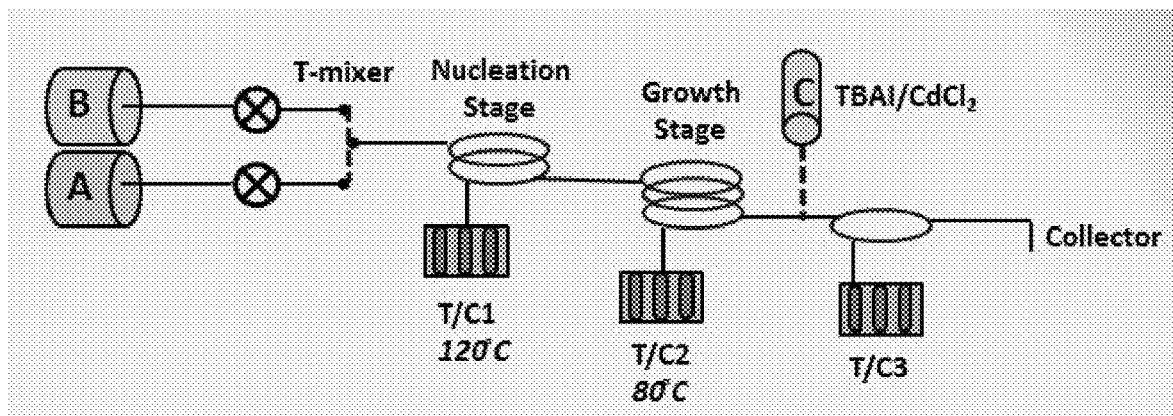
Figure 2.1. Schematic illustration
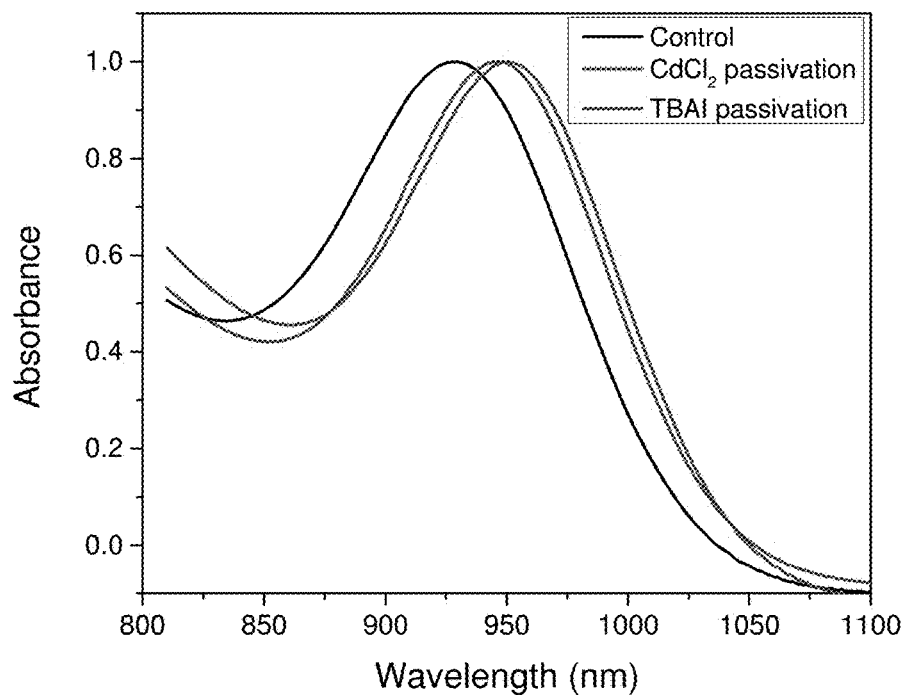
Figure 2.2. Uv-vis absorption comparison

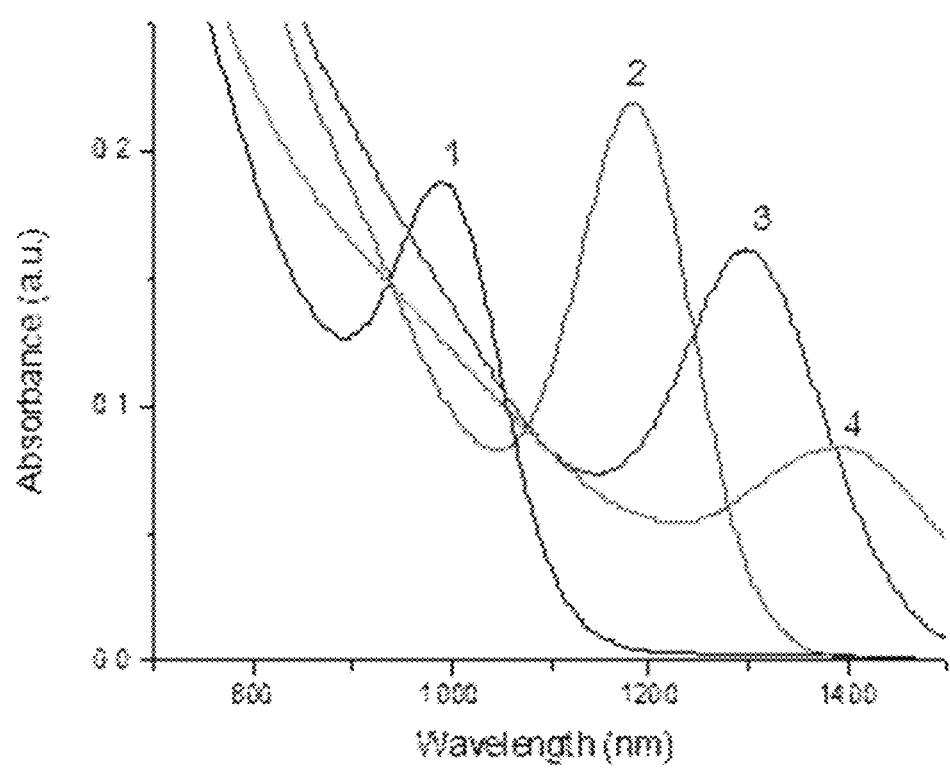
Figure 3.1A

| No. | Temperature | Peak position | Peak/valley |
|---|---|---|---|
| 1 | 80 | 991 | 1.48 |
| 2 | 100 | 1182 | 2.65 |
| 3 | 120 | 1296 | 2.39 |
| 4 | 140 | 1390 | 1.54 |

Vol A = 0.8 ml, Vol B = 1.2 ml

SYSTEM AND METHOD FOR MAKING QUANTUM DOTS

CROSS-REFERENCE TO RELATED APPLICATIONS

This application is a divisional of U.S. application Ser. No. 15/025,918 filed on Mar. 30, 2016, which is a National Stage of International Application No. PCT/IB2014/003155, filed 3 Oct. 2014, having the title "SYSTEM AND METHOD FOR MAKING QUANTUM DOTS" which claims the benefit of and priority to U.S. Provisional Application entitled "System and Method for Making Quantum Dots," having Ser. No. 61/886,837, filed on 4 Oct. 2013, US. Provisional Application entitled "System and Method for Making Quantum Dots," having Ser. No. 61/890,536, filed 14 Oct. 2013, and U.S. Provisional Application entitled "System and Method for Making Quantum Dots," having Ser. No. 62/024,490, filed 15 Jul. 2014, the contents of all of which are incorporated by reference as if fully set forth herein.

BACKGROUND

Colloidal quantum dots (CQDs) are versatile materials of interest to many fields in view of their programmable optoelectronic properties. PbS CQDs are of particular interest in solar photovoltaics applications, in which the semiconductor's large Bohr exciton radius enables quantum-size-effect tuning over the broad solar spectrum, including the infrared portion. All prior reports of the best-performing CQD photovoltaics have relied on a manual batch synthesis. The traditional CQD batch synthesis relies on elemental precursor solutions; organic surfactants that will act as ligands; and a dispersing solvent. In the standard hot-injection method, a solution containing one precursor is heated to a chosen temperature; and a second precursor is injected into this solution. Sudden nucleation of CQD seeds results. This is followed by particle growth, producing a monodisperse dispersion of CQDs. Scaling up such syntheses in a batch setup is limited by the difficulties associated with quenching the reaction over a brief time interval inside a large reactor. Thus, there is a need to overcome these deficiencies and limitations.

SUMMARY

Embodiments of the present disclosure provide for methods of making quantum dots (QDs) (passivated or unpassivated) using a continuous flow process, systems for making QDs using a continuous flow process, devices including the QDs formed using these methods and systems, and the like.

An embodiment of the method of forming a quantum dot (QD), among others, includes: a) mixing a solution A with a solution B to form solution C; b) flowing solution C into a nucleating coil to produce QD seeds by nucleating solution C at a first temperature; and c) flowing solution C including the QD seeds into a growth coil to grow the QDs at a second temperature, wherein b) and c) are independently performed, and wherein the first temperature and the second temperature are different. In an embodiment, the method can also include: d) introducing the QDs from c) to a solution; and e) flowing the mixture of QDs and the solution of step d) through a final loop, wherein b), c), d), and e) are independently performed.

An embodiment of the system for making a QD, among others, includes: a mixing device for receiving solution A and solution B, wherein the mixing device is configured to mix solution A and solution B to form solution C; a first coil in fluidic communication with the mixing device, wherein the first coil is configured to form QD seeds from solution C via nucleation; and a second coil is positioned in serial communication with the first coil, wherein the second coil is in fluidic communication with the first coil, wherein the second coil is configured to grow the QDs from the QD seeds, wherein the first coil and the second coil are independent of one another. In an embodiment, the system can also include: an introduction port positioned after the second coil to introduce a solution to the QDs; and a third coil positioned in serial communication with the second coil, wherein the first coil, the second coil, and the third coil are independent of one another.

In yet another embodiment a device is provided comprising QDs produced using the aforementioned method. The device can be, for example a solar photovoltaic cell, light emitting diode (LED) display, an infra red detector, or a UV-vis detector.

In any one or more aspects of the aforementioned embodiments the mixing can be conducted using a mixing device such as a mixing chip. The first coil (nucleating coil) can be operated at a first temperature of about 110 to 130° C. and the second coil (growth coil) can operated at a second temperature of about 70 to 90° C. The QDs can be made in a continuous flow process or system. Solution A and solution B can include a fluorinated fluid. The solution introduced to the QDs can include $CdCl_2$, TBAI, CO, tetrabutylammonium bromide, tetrabutylammonium chloride, inorganic halides, pseudohalides, halometallate ligands, or any combination thereof.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

FIGS. 1.1A-1.1B: 1.1A is a schematic of a conventional batch synthesis set-up and FIG. 1.1B is a schematic of a dual-stage continuous flow reactor setup with precursor A (Pb-oleate, ODE), precursor B (TMS in ODE).

FIG. 1.2 illustrates the absorbance and PLQE of PbS CQDs synthesized with a single-stage flow approach compared to batch synthesis and dual-stage flow setup.

FIG. 1.3 illustrates the temperature dependences of the critical radius $R_C$ (1) and the growth rate (2) calculated for $\Delta=0.4$ eV, $\gamma=0.1$ eV, $a_0=0.2$ nm, $n_0=3\cdot10^{-5}$ and $\delta=0.05$. The vertical dotted line indicates possible optimum value of $T_N$.

FIG. 1.4 illustrates the particle growth rate $W(R,T)$ as a function of particle radius at $T_G=80°$ C. (1) and $T_G=120°$ C. (2). Vertical dotted lines roughly indicate the span of particle sizes hence the growth rates at the entrance of the growth stage.

FIGS. 1.5A-1.5C illustrates the absorbance and HWHM of PbS CQDs synthesized with a dual-stage while A) varying temperature for the nucleation temperature stage, B) varying temperature for the growth temperature stage, and C) varying residence time.

FIGS. 1.6A-1.6D: 1.6A illustrates a comparison of the absorption spectra and PLQE of traditional synthesis of quantum dots with the dual-stage flow synthesis after purification showing comparable FWHM. FIG. 1.6B illustrates a TEM image of PbS CQD ($\lambda_{max} \approx 950$ nm) synthesized by flow reactor, and XPS comparison of oxygen (FIG. 1.6C) and carbon (FIG. 1.6D) contents of OA-capped films.

FIGS. 1.7A-1.7B illustrates photovoltaic devices made based on PbS CQD obtained from batch synthesis and flow reactor synthesis with MPA treatment to compare A) their JV-characteristics and B) their EQE response.

FIGS. 1.8A-1.8B illustrates XPS data for Pb and S comparing PbS CQDs made from batch synthesis and dual-stage flow reactor synthesis.

FIG. 2.1 is a schematic illustration of an embodiment of the present disclosure.

FIG. 2.2 shows the comparison of three different samples: unpassivated dots, $CdCl_2$ passivated dots, and TBAI passivated dots.

FIG. 3.1A illustrates the absorbance of different PbS CQDs synthesized under different temperatures, wherein the ratio of Pb and S precursor is consistent, octadecene was used as solvent, residence time was 96 sec, and 2 ml reaction coil was used.

FIG. 3.1B shows the absorption peak position and the peak to valley ratio of the different PbS CQDs obtained under different temperature.

DETAILED DESCRIPTION

Discussion

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, synthetic inorganic chemistry, analytical chemistry, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in bar. Standard temperature and pressure are defined as 0° C. and 1 bar.

It is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Definitions

The term "quantum dot" can include, but is not limited to, luminescent semiconductor quantum dots. In general, quantum dots include a core and optionally a cap. However, uncapped quantum dots can be used as well. The "core" is a nanometer-sized semiconductor. While any core of the IIA-VIA, IIIA-VA, or IVA-VIA semiconductors can be used in the context of the present disclosure, the core is such that, upon combination with a cap, a luminescent quantum dot results. A IIA-VIA semiconductor is a compound that contains at least one element from Group IIA and at least one element from Group VIA of the periodic table, and so on. The core can include two or more elements. In one embodiment, the core is a IIA-VIA, or IIIA-VA, semiconductor that can be about 1 nm to about 250 nm, about 1 nm to 100 nm, about 1 nm to 50 nm, or about 1 nm to 10 nm in diameter. In another embodiment, the core can be a IIA-VIA semiconductor and can be about 2 nm to about 10 nm in diameter. For example, the core can be CdS, CdSe, CdTe, ZnSe, ZnS, PbS, PbSe, or an alloy.

The "cap" is a semiconductor that differs from the semiconductor of the core and binds to the core, thereby forming a surface layer on the core. The cap typically passivates the core by having a higher band gap than the core. In one embodiment, the cap can be a IIA-VIA semiconductor of high band gap. For example, the cap can be ZnS or CdS. Combinations of the core and cap can include, but are not limited to, the cap is ZnS when the core is CdSe or CdS, and the cap is CdS when the core is CdSe or PbS. Other exemplary quantum does include, but are not limited to, CdS, ZnSe, CdSe, CdTe, $CdSe_xTe_{1-x}$, InAs, InP, PbTe, PbSe, PbS, HgS, HgSe, HgTe, CdHgTe, CuInS, CoS, $Co_2S_3$, and GaAs. The size of the cap can be about 0.1 to 10 nm, about 0.1 to 5 nm, or about 0.1 to 2 nm in diameter.

The wavelength emitted (e.g., color) by the quantum dots can be selected according to the physical properties of the quantum dots, such as the size and the material of the nanocrystal. Quantum dots are known to emit light from about 300 nanometers (nm) to 2000 nm (e.g., UV, near IR, and IR). The colors of the quantum dots include, but are not limited to, red, blue, green, and combinations thereof. The color or the fluorescence emission wavelength can be tuned continuously. The wavelength band of light emitted by the quantum dot is determined by either the size of the core or the size of the core and cap, depending on the materials that make up the core and cap. The emission wavelength band can be tuned by varying the composition and the size of the QD and/or adding one or more caps around the core in the form of concentric shells.

General Discussion

Embodiments of the present disclosure provide for methods of making quantum dots (QDs) (passivated or unpassivated) using a continuous flow process, systems for making QDs using a continuous flow process, and the like. In one or more embodiments, the QDs produced using embodiments of the present disclosure can be used in solar photovoltaic cells, bio-imaging, IR emitters, LEDs, infra red detectors, or UV-vis detectors.

Embodiments of the present disclosure can produce QDs (e.g., passivated or unpassivated such as PbS QD or passivated PbS QD) by dividing the nucleation and the growth into separate steps, which can be advantageous as compared to currently used technologies. For example, embodiments of the present disclosure can be automated and are scalable so that QDs can be efficiently produced. In addition, the size of the QDs can be controlled and the results are reproducible. Furthermore, embodiments of the present disclosure can achieve monodispersity and high quality, which enables the produced QDs to be used in devices such as colloidal QD photovoltaic devices.

As mentioned above, an embodiment of the system can be advantageous by separating the nucleation step and the growth step so that the steps are in series with one another. Having the nucleation step and the growth step in series allows for a continuous flow process to be used to produce the QDs. In an embodiment, the system includes a mixing device to mix two or more reagent solutions, a first coil configured to form QD seeds from a mixture via nucleation, and a second coil positioned in serial with the first coil, where the second coil is configured to grow the QDs from the QD seeds. Optionally, an embodiment of the system can include an introduction port to introduce a solution of $CdCl_2$ or tetrabutylammonium iodide (TBAI) precursor. In the alternative to $CdCl_2$ or TBAI precursor, the solution can be tetrabutylammonium bromide, tetrabutylammonium chloride as well as inorganic halides, pseudohalides, halometallate ligands, or combinations of any of these solutions. In an embodiment, the solution can have a concentration of about 0.2 to 0.6 M solution or about 0.4 M solution.

The mixing device is in fluidic communication with the first coil, and the first coil is in fluidic communication with the second coil. In an embodiment, a flow system can be used to fluidically connect the mixing device to the first coil and the first coil to the second coil. In an embodiment, the flow of the solutions can be controlled and can be adjusted in one or more portions of the system. In an embodiment, the flow is constant and can be about 0.5 to 2 ml/min. or about 1 to 1.2 ml/min. However, the flow can be adjusted based on the length of the tubes and coils, the diameter of the tubes and coils, the temperature of the coils, the reagents, and the like.

In one or more embodiments, the mixing device can receive a solution A and a solution B, which can be used to ultimately form the QDs. In an embodiment, the mixing device is configured to mix solution A and solution B to form solution C. In an embodiment, the mixing device can include a mixing chip, heating column, or the like. In an embodiment, the mixing chip can include a microfluidic mixing chip.

In one or more embodiments, the mixing device can be in fluidic communication with one or more containers that include solution A, solution B, and one or more other containers that include one or more other reagents, solvents, and the like. The containers including solution A, solution B, etc., can be continuously stirred, and the temperature in each container can be independently controlled and maintained. In an embodiment, the flow system can include one or more flow meters to control the volume ratio of the solutions introduced to the mixing device and/or exiting the mixing device.

In one or more embodiments, the solutions (e.g., solution A, solution B, etc.) introduced into the mixing device can include a fluorinated fluid such as $C_{15}F_{33}N$, $C_{18}H_{39}N$, or a combination thereof. In an embodiment, the fluorinated fluid can include a Fluorinert® Electronic Liquid such as FC-70, FC-71, and FC-770. In an embodiment, the percent volume of the fluorinated fluid in the mixture in the solution A and solution B can be about 20 to 60, and the percent volume in the solution C (the mixed solution) can be about 20 to 60. In an embodiment, use of the fluorinated fluid is advantageous because of the properties of fluorinated fluids, which can include one or more of the following: high density, high heating transfer, inert reaction media, thermally and chemically stable, compatibility with sensitive materials such as those used to produce the QDs, and the like.

Once solution C is formed, solution C can be flowed to the first coil using the flow system. Once in the first coil, QD seeds can be formed via nucleation. In an embodiment, the QD seeds can have a diameter of about 0.5 to 2 nm. In an embodiment the first coil can be operated so that solution C is at a first temperature of about 25 to 35° C., about 110 to 130° C., or about 120° C., for a period of time while in the first coil. The temperature of the first coil can be controlled using heat mantle, oil bath, or metal heater. In an embodiment, the first coil can be made of Teflon, PFA, PTFE, FEP, PVDF, or ETFE. In an embodiment, the first coil tubing can have a length of about 50 mm to 300 mm. In an embodiment, the first coil tubing can have a diameter of about 0.2 mm to 1 mm. In an embodiment, the diameter of loops of the first coil can be about 0.2 mm to 1 mm. In an embodiment, the first coil can have a volume of about 0.2 ml to 1 ml.

Solution C, including the QD seeds, can be flowed from the first coil to the second coil using the flow system. The first coil and the second coil are positioned in serial with one another, where a connector tube can be positioned between the first coil and the second coil so that they are in fluidic communication and/or so that the temperatures can be operated independently. Once in the second coil, the QD seeds can be grown into QDs, where the dimensions and/or surface of QDs can be controlled and regulated. In an embodiment, the first coil and the second coil are operated independently of one another. In particular, the temperature of the first coil and the temperature second coil are operated independently of one another so as to optimize the nucleation process (first coil) and the growth process (second coil). In one or more embodiments the second coil can be operated so that solution C is at a first temperature of about 110 to 130° C., while in the second coil, the temperature is about 70 to 90° C. or about 80° C. for a period of time, where the time can be adjusted accordingly to form the desired products.

In one or more embodiments, the second coil can be made of Teflon, PFA, PTFE, FEP, or ETFE. In an embodiment, the second coil tubing can have a length of about 300 mm to 1800 mm. In an embodiment, the second coil tubing can have a diameter of about 0.2 mm to 1 mm. In an embodiment, the diameter of loops of the second coil can be about 0.2 mm to 1 mm. In an embodiment, the second coil can have a volume of about 2 ml to 50 ml.

Optionally, after the second coil, an introduction port can be used to introduce a solution including $CdCl_2$, CO, TBAI, tetrabutylammonium bromide, tetrabutylammonium chloride, inorganic halides, pseudohalides, halometallate ligands, a combination thereof, or precursors thereof to the solution including the QDs. The introduction port can be a mechanical or electronically controlled flow valve or the like.

Optionally, after the second coil and the introduction port, a third coil can be incorporated into the system. The second coil and the third coil are positioned in serial with one another, where a connector tube (e.g., having the introduction port in fluidic connection with the connector tube) can be positioned between the second coil and the third coil so that they are in fluidic communication and/or so that the temperatures can be operated independently. In the third coil the QDs can be passivated with the $CdCl_2$, CO, TBAI, tetrabutylammonium bromide, tetrabutylammonium chloride, inorganic halides, pseudohalides, halometallate ligands, a combination thereof, or a precursor thereof, where the passivation can be controlled and regulated. In an embodiment, the first coil, the second coil, and the third coil are operated independently of one another. In particular, the temperature of the first coil, the temperature of the second coil, and the temperature of the third coil can be operated independently of one another so as to optimize the nucleation process (first coil), the growth process (second coil), and the passivation process. In one or more embodiments the third coil can be operated so that solution in the third coil is at a third temperature of about 70 to 30° C. for a period of time to achieve the desired passivation.

In an embodiment, the third coil can be made of Teflon, PFA, PTFE, FEP, or ETFE. In an embodiment, the third coil tubing can have a length of about 10 mm to 100 mm. In an embodiment, the third coil tubing can have a diameter of about 0.2 mm to 1 mm. In an embodiment, the diameter of loops of the second coil can be about 0.2 mm to 1 mm. In an embodiment, the third coil can have a volume of about 0.5 ml to 6 ml.

In one or more embodiments the second coil or the third coil is in fluidic communication with a collection device. Once in the collection device, the QDs can be separated, rinsed, collected, or otherwise processed. In an embodiment, the QDs collected can have a diameter of about 2 nm to 10 nm.

In an embodiment, the pump can be a syringe pump, a HPLC pump, a gear pump, a peristaltic pump, a coriolis device or any pump capable of delivering a up to 1-10 bar pressure.

In an embodiment, the pumps can drive the fluid stream(s) through an injection loop. Injection loops are known in the art and are commonly used for applications such as liquid chromatography. Injection loops allow for a precise timing and amount of reactant to be injected into the reactor flow stream. Suitable injection loops are available from a variety of manufacturers including Valco Instruments Co. Inc. of Houston, Tex. In an embodiment, the first pump can drive the first fluid stream through a first injection loop where one or more reactants can be injected into the first fluid stream. In an embodiment, the second pump can drive the second fluid stream through a second injection loop where one or more reactants can be injected into the second fluid stream. In an embodiment, the rotor seal in the injection loop is made from a corrosion resistant material and thus withstands amines and corrosive reagents.

Now having generally described embodiments of the system, focus is now directed to embodiments of the method. In an embodiment, the method of forming the QD includes mixing two or more solutions, flowing the mixture into a nucleating coil (also referred to as the "first coil") to produce QD seeds, and flowing the mixture including the QD seeds into a growth coil (also referred to as the "second coil") to grow the QDs. Optionally, the QDs can be introduced to a solution including $CdCl_2$, CO, TBAI, tetrabutylammonium bromide, tetrabutylammonium chloride, inorganic halides, pseudohalides, halometallate ligands, a combination thereof or a precursor thereof and then passivated. Once the QDs are produced, the QDs can be flowed into a collection device, as described herein.

As described above in reference to the mixing device, solution A and solution B can be mixed to form solution C. In an embodiment, solution A and B can be mixed using a mixing device as described herein. In an embodiment, the volumetric ratio of solution A and solution B (and optionally other solutions) can be controlled so that the desired QD seeds and QDs are formed in the method. Also, as described above, the solutions can be disposed in one or more containers in fluidic communication with the mixing device. In addition, the method includes the use of a flow system that can be used to control the flow of the solutions through the various steps.

Once solution C is formed, solution C can be flowed into the nucleating coil to produce QD seeds by nucleating solution C at a first temperature as described above. The nucleating coil (as the first coil) is described above in reference to the system. The first temperature can be controlled to optimize the nucleation of the QD seeds.

Solution C, including the QD seeds, is subsequently flowed into the growth coil to grow the QDs. The growth coil (as the second coil) is described above in reference to the system. As described herein the second temperature can be controlled to optimize the growth of the QDs. The first temperature and the second temperature are different, where each of the first temperature and the second temperature are selected for nucleation of the QD seeds or growth of the QDs, respectively.

Optionally, a third coil and a mixing chip can be used to passivate the core QDs using $CdCl_2$ CO, TBAI, tetrabutylammonium bromide, tetrabutylammonium chloride, inorganic halides, pseudohalides, halometallate ligands, a combination thereof, or precursors thereof and in particular can use a halide or cadmium treatment. Also, it will be possible to grow a shell (CdS or ZnS) on the core QDs.

Now having described the method of making QDs in general, the following describes a specific embodiment of making PbS QDs. Additional details are provided in Examples 1 or 2.

In an embodiment to produce PbS QDs (e.g., unpassivated or passivated PbS QDs), two separate precursor solution can be used. In an embodiment, a lead precursor (e.g., lead oleate) can be prepared by mixing about 0.9 g lead oxide (PbO), about 3 ml 1-octadecene (ODE), and about 6 ml oleic acid (OA) at about 100° C. for about 16 h. In an embodiment, a sulfur precursor can be prepared by mixing bis(trimethylsilyl) sulfide (TMS) and ODE. In an embodiment, the fluorinated fluid (e.g., FC-70) can be degassed for a period of time (e.g., about 10 h). In an embodiment, a flow degasser can be used in-line. For example, a gas module with vacuum applied or a standard HPLC degasser including a perflouropolymer tube permeable to gasses can be used, which would render this embodiment a true flow process by not relying on a batch degassing process. When the two precursors are flowed into separate containers, each can be mixed with degassed fluorinated fluid while under strong stirring. Both the container can be filled with $N_2$, while the container including the sulfur precursor can be keep at 60° C. to prevent solidification. A schematic illustration of this set up is presented in FIG. 1.1A.

The lead precursor/fluorinated fluid mixture can be referred to as solution A, while the sulfur precursor/fluorinated fluid mixture can be referred to as solution B. In particular, solution A can include about 360 µl TMS, about 20 ml ODE, and about 20 ml FC-70, while solution B can include about 9 ml lead oleate precursor, about 30 ml ODE, and about 20 ml FC-70. Each of solutions A and B are flowed into a mixing device such as a mixing chip. In an embodiment, the volume ratio A:B can be about 1:1.36. In an embodiment, the flow rate can be about 1.11 ml/min. The mixture (solution C) can be flowed from the mixing device to the first coil (temperature of about 120° C.) to form QD seeds. Next the mixture including the QD seeds is flowed to the second coil (temperature of about 80° C.) to form the PbS QDs.

Optionally, a solution including $CdCl_2$ CO, TBAI, tetrabutylammonium bromide, tetrabutylammonium chloride, inorganic halides, pseudohalides, halometallate ligands, a combination thereof, or a precursor thereof is introduced to the PbS QDs after the second coil using the introduction port. The mixture is then flowed into a third coil to passivate the PbS QDs.

After the second coil or third coil, the product can be collected at various time frames. Each collected product can be centrifuged, washed with toluene and acetone (e.g., twice), and redissolved in toluene. FIG. 1.6A illustrates a TEM of a collected sample. In an embodiment, the peak to valley ratio of a sample is almost 2.9, which is higher than the reported data. In an embodiment, the size distribution of the QDs with absorption peak about 950 nm can be obtained. It should be noted that the variables (e.g., flow rate, volume ratio, temperature, and the like) can be varied depending on the desired QDs to be formed. Also, although the QDs formed are PbS QDs, other types of QDs are contemplated to be made using embodiments of the present disclosure.

In an embodiment, the formed QD can be CuInS, and can optionally be passivated with $CdCl_2$, TBAI, or CO. In an embodiment, the formed QD can be CoS or $Co_2S_3$, where each can be passivated with $CdCl_2$, TBAI, or CO.

EXAMPLES

Now having described various embodiments of the disclosure, in general, the examples describe some additional embodiments. While embodiments of the present disclosure are described in connection with the example and the corresponding text and figures, there is no intent to limit embodiments of the disclosure to these descriptions. On the contrary, the intent is to cover all alternatives, modifications, and equivalents included within the spirit and scope of embodiments of the present disclosure.

Example 1

Brief Introduction:

A dual-stage flow reactor synthesis of PbS colloidal quantum dots (CQDs) is described herein and a comparison of PbS colloidal QDs prepared with this system and conventional batch synthesis is performed. A theory simulation was fitted to control the nucleation and growth process. High photoluminescence quantum yield (50%) and narrow full width-half max values demonstrate the good quality of the flow-synthesized CQDs. The solar cell fabricated from the flow-synthesized PbS CQDs achieves on-par performance with the batch synthesized CQDs at a power conversion efficiency of 4.8%.

Introduction:

Colloidal quantum dots (CQDs) are versatile materials of interest to many fields in view of their programmable optoelectronic properties.[1,2] PbS CQDs are of particular interest in solar photovoltaics applications, in which the semiconductor's large Bohr exciton radius enables quantum-size-effect tuning over the broad solar spectrum, including the infrared portion.[2] Compared to other third-generation photovoltaic materials such as CIGS[3,4] and CZTS,[5,6] CQD thereby offer avenues to tandem and multi junction solar cells from a single material via size-effect bandgap tunableness. Their processing from the solution phase should in principle allow rapid, large-scale manufacture and ready integration with flexible substrates, facilitating roll-to-roll processing.

Herein we identify, and then address, one key impediment that currently prevents CQDs from fulfilling their tremendous promise. All prior reports of the best-performing CQD photovoltaics[7,9] have relied on a manual batch synthesis. In this work, we develop an automated, scalable, in-line synthesis methodology. We show that, only by incorporating an innovative two-stage reactor system, can we achieve the monodispersity and surface quality required to reach the best previously-reported CQD photovoltaic performance.

The traditional CQD batch synthesis relies on elemental precursor solutions; organic surfactants that will act as ligands; and a dispersing solvent.[10,11] In the standard hot-injection method, a solution containing one precursor (precursor A in FIG. 1.1a) is heated to a chosen temperature; and a second precursor (precursor B) is injected into this solution. Sudden nucleation of CQD seeds results, and this is followed by particle growth, producing a monodisperse dispersion of CQDs.[12] Scaling up such syntheses in a batch setup is limited by the difficulties associated with quenching the reaction over a brief time interval inside a large reactor.[13]

In the past decade, continuous flow synthesis has emerged as a compelling technology enabling large-scale production while offering several advantages including improved control of heat and mass transfers, precise cooling rates, and reproducibility.[14-16] Additionally, the flow regime allows rapid screening of parameters, automation, and low reagent consumption during optimization.[16] In flow synthesis, the use of a narrow channel diameter decreases the dispersion in the velocity of the solution, potentially enabling a higher degree of monodispersity. Since the first flow synthesis of nanocrystals in 2002, a variety of nanomaterial has been synthesized using flow reactors,[17-16] including a wide range of metal,[26-24] metal oxide,[25-30] and even metal/metal oxide core-shell nanoparticles.[31] Even though the synthesis of colloidal quantum dots (CQDs), such as CdS,[32,33] CdSe,[13-16,32,34-36] InP,[37] and SnTe,[38] via flow reactor synthesis is becoming increasingly popular, achieving a high quality product still represents a challenge. Prior efforts have sought to narrow the particle size distribution via segmented flow instead of the traditional laminar flow.[14,26,33,34] By segmenting the flow of the reacting phase with an immiscible inert liquid (i.e. liquid-liquid segmentation), the reagent dispersion becomes confined to the volume of the isolated droplets rather than dispersing along the entire length of the channel.[16,39] Accordingly, the flow of droplets provides high mixing efficiency, which is essential in particle size control. Distributed temperature zones within the capillary microreactor has been applied in previous work to synthesize narrower size-distribution CdSe CQDs.[13] Inspired by this, we use a two-stage reactor system to realize high quality PbS quantum dots by controlling the nucleation and growth process, which was in accord with theory simulation.

Results and Discussion

The flow reactor system created for, and deployed in, the present work is depicted schematically in FIG. 1.1B. Precursor solutions are prepared as in batch synthesis, only deviating by the addition of an inert, immiscible fluid (Fluoroinert FC-70) that aids in maintaining clean reaction channels and keeping a consistent reaction volume and flow rate. Precursor A contains of lead oxide, oleic acid (OA) and octadecene (ODE). Precursor B contains trimethylbihexyl-sulfide and ODE. The two precursors are injected under $N_2$ overpressure through micropumps at different points into the mixing stage. The temperature of this stage is set low enough to prevent premature reaction of the compounds. The mixed reactants proceed together to the nucleation stage that is temperature-controlled with the aid of thermocouple 1. The elevated temperature causes the precursors to react and form nucleation seeds. The purification procedure is similar to the established batch synthesis, involving precipitation of the CQDs using acetone and subsequent redispersal in toluene.

We investigated absorbance and photoluminescence behavior of CQDs produced using this single-temperature stage approach. At a reaction temperature of 75° C., the approach yielded CQDs with lower quality than their conventional batch synthesis counterpart, seen in their worse excitonic feature definition (notably lower peak-to-valley ratio, FIG. 1.2). Additionally, we found the nanoparticles have a low photoluminescence quantum efficiency (PLQE) as well as a broader full-width-at-half-maximum (FWHM) of the PL signal, as summarized in Table 1.

TABLE 1

Reaction conditions and optical quality assessment of PbS CQDs produced by batch synthesis, single-stage, and dual-stage flow synthesis with $T_N$ being the injection temperature to start nucleation in the batch synthesis and in the nucleation stage of a flow reactor, and $T_G$ being the temperature at which growth occurs, and with Stokes shift, PLQE, and FWHM of PL signal to verify CQD quality.

| Synthesis Type | $T_N$/ °C. | $T_G$/ °C. | Abs position/ nm | PL position/ nm | PLQE/ % | FWHM/ eV |
|---|---|---|---|---|---|---|
| Batch Syn. | 90 | Slow cooling | 968 | 1071 | 48.8 | 0.114 |
| Single-Stage Flow Syn. | — | 75 | 951 | 1052 | 28.2 | 0.131 |
| Dual-Stage Flow Syn. | 120 | 85 | 970 | 1065 | 50.6 | 0.110 |

We hypothesized that much greater control over the temperature profile in time/space in the flow chamber would be required to produce high-quality CQDs. Specifically, we postulated that separating the nucleation and growth processes could add a much-needed increased degree of control. This would allow growth to occur at a lower temperature than that of nucleation and allow the opportunity for size focusing to produce a narrower size distribution within the CQD population.

Table 1 summarizes the synthesis conditions and key quality indicators for CQDs having a bandgap of ~1.3 eV for three cases: batch, single-stage flow, and dual-stage flow syntheses. CQDs made using the dual-stage flow synthesis are superior in their lower Stokes shift, higher PLQE, and a narrower PL FWHM compared to single-stage flow synthesis.

To illustrate the rationale behind two-stage reactor consider a simple model of particle nucleation and growth from a one component solution. In this model we assume that nucleation of particles takes place only in the first stage controlled by $T_N$ while the growth process is controlled only by $T_G$ in the second stage and is independent of the nucleation stage. We also assume that all particles have spherical shape and their cumulative volume is low such that the material concentration $n_0$ in the solution can be assumed constant.

Both nucleation and growth of particles are characterized mainly by two parameters: critical radius $R_C$ and Gibbs-Thomson concentration $n_{GT}(R)$.[40] The former determines the smallest possible particle radius produced in the nucleation stage. The latter determines the growth rate of particles in the both stages. It is instructive to present here expressions for both these parameters using the fact that they are the characteristics of thermal equilibrium between given particle and surrounding solution. According to thermal equilibrium condition we can equate chemical potentials of atoms/molecules in solution and in the particle of radius R $$k_B T \cdot \ln(n) - \varepsilon_L = -\varepsilon_S + \frac{2a_0 \gamma}{R} \quad (1)$$

where $k_B$ is the Boltzman's constant, T is absolute temperature, $\varepsilon_L$,$>0$($\varepsilon_S$>$\varepsilon_L$) are absolute values of the material energy per atom in the solution and solid state, respectively, $a_0$ is average inter-atomic distance in the particle, $\gamma$ is surface energy of particle per surface atom. Critical radius is obtained from Eq. (1) by fixing n at $n_0$ $$R_C = \frac{2a_0\gamma}{k_B T_N \cdot \ln(n) + \Delta} (\Delta = \varepsilon_S - \varepsilon_L)$$

while Gibbs-Thomson concentration is derived under condition of fixed R as $n_{GT}$ $$n_{GT}(R) = \exp\left[-\frac{\Delta}{k_B T} + \frac{2a_0\gamma}{R k_B T}\right].$$

Assuming that the growth process in the reactor is surface reaction controlled we may write the main equation for particle size growth rate W(R,T)

$$\frac{dR}{dt} = W(R, T) = K \cdot (n_0 - n_{GT}(R, T)) \quad (2)$$

where K is surface reaction rate.

For further discussion it is convenient to use the plots of $R_C(T)$ and $W((1+\delta) \cdot R_C, T)$, where $\delta \ll 1$ is a constant reflecting small fluctuational growth of nucleated particle over $R_C$ (as $W(R_C, T) \equiv 0$). The other model parameters are taken as a reasonable estimate for some hypothetical but typical material. The plots shown in FIG. 1.3 characterize nucleation stage of the reactor.

Just nucleated particles have the radius around $R_C$ and are in the unstable equilibrium with the solution. They may grow or collapse depending on whether their radius is increased or decreased due to fluctuations. The width of particle size distribution is roughly determined by the size of particles which have nucleated at the beginning of nucleation stage and those nucleated at its end. The former particles while passing the nucleation stage grow at the rate dependent on $T_N$ as indicated in FIG. 1.3. The particles nucleated at the end have the radius around $R_C$. According to FIG. 1.3 the growth rate decreases as a function of $T_N$, therefore higher $T_N$ result in narrower size distributions. At the same time the critical radius hence nucleation barrier are higher at higher $T_N$ resulting in much lower numbers of nucleated particles. Therefore for optimum performance of the reactor an optimum value of $T_N$ has to be chosen.

Then the particles enter the growth stage with the size distribution roughly indicated by vertical dotted lines in FIG. 1.4. Comparing growth rates shown by curves 1 and 2 it is clear that the lower growth temperature would result in narrower final size distribution due to the smaller variation of W(R,T) as a function of R. Based on the above consideration we may conclude that an optimum performance of the two-stage reactor requires some optimum value of $T_N$ chosen to according the requirements in the mass production and size inhomogeneity, and $T_G$ has to be chosen below $T_N$ to avoid significant broadening of particle size distribution produced in the nucleation stage.

So far we considered only critical and supercritical particles ($R \geq R_C$). In reality there are many subcritical particles with $R < R_C$, which start to form right at the entrance of the nucleation zone. It takes a while until some of them become critical or supercritical. If the passage time through the nucleation zone is relatively short the fraction of subcritical particles can be very high. If these particles are quenched by transferring into the cold zone where they become supercritical they significantly broaden the particle size distribution. It is important therefore to use such value of the total residence time $t_R$ which on one hand allows to keep the fraction of subcritical particles low at the same time avoiding over-broadening of size distribution for supercritical particles.

Using the above qualitative arguments we explored detailed optimization of the dual-stage approach empirically by separately varying the nucleation temperature $T_N$ (FIG. 1.5A), the growth temperature $T_G$ (FIG. 1.5B) and the total residence time $t_R$ (FIG. 1.5C). The main parameters used as the indicators of the optimization quality are the full width at the half-maximum (FWHM) and the position of the excitonic absorption peak (PEAP) for each PbS CQD sample (FIG. 1.5). Keeping $t_R$ fixed at about 3 minutes we investigated the impact of $T_N$ (FIG. 1.5A) on the PEAP and FWHM at constant $T_G=80°$ C. and the impact of $T_G$ at constant $T_N=120°$ C. Increasing nucleation temperature shifts the CQD excitonic peak to higher wavelength, indicating larger particles. From the HWHM, we find that an optimum $T_N$ is around 120° C. To achieve the optimal single-junction solar cell bandgap of ~1.3 eV, combined with a narrow particle size distribution, we then fixed the nucleation temperature at 120° C. in subsequent experiments. When studying the effect of growth temperature $T_G$ (FIG. 1.5B), we kept $T_N$ constant at 120° C. and $t_R$ at 3 minutes. For growth temperatures below 80° C. a moderate increase of the absorption peak wavelength and commensurable increase in HWHM is observed. Above 80° C., the increase is much steeper and the HWHM decreases rapidly. This behavior is explained in our qualitative analysis by a broader distribution of particle growth rates. Lastly, we optimized the residence time at constant $T_N$ (120° C.) and $T_G$ (80° C.)(FIG. 1.5C) and found that the smallest HWHM for an excitonic peak wavelength of ~950 nm was achieved using ~3 minutes.

We now offer a detailed spectroscopic and compositional analysis of optimized dual-stage flow synthesis CQDs compared to the best reported batch synthesis (FIG. 1.6A). The HWHM is, with this optimization, comparable to batch-synthesized dots. Following purification by precipitation and redispersion, the flow reactor CQDs remain highly monodisperse, as seen from the narrow HWHM of excitonic peak and by the high quality of the nanocrystals in TEM images (FIG. 1.6B). A comparable amplitude of photoluminescence further confirms the quality of the CQDs. The elemental composition of the two synthesis methods was compared using X-ray photoelectron spectroscopy (XPS): carbon (FIG. 1.6D) and oxygen (FIG. 1.6C) contents of the flow reactor synthesized PbS CQDs agree well with the signatures seen in XPS of batch synthesized CQDs. The same agreement is observed for lead and sulfur binding energy signatures (FIGS. 1.8A-1.8B).

Having validated the quality of the PbS CQDs material synthesized in the dual-stage flow reactor approach, we proceeded to fabricate photovoltaic devices in the depleted heterojunction architecture,[41] in which the $TiO_2$ film serves as the n-type semiconductor. We measured the current-voltage characteristics (FIG. 1.7A) in an inert nitrogen environment under 100 mW $cm^{-2}$ simulated AM1.5G illumination and the corresponding qualitative external quantum efficiency (EQE) spectrum (FIG. 1.7B) of PbS CQDs devices made from conventional or flow reactor methods. The devices obtained from the flow reactor exhibited solar power conversion efficiency (PCE) of 4.8% with an open circuit voltage of 0.51 V, a short circuit current density of 18.35 mA $cm^{-2}$, and a fill factor of 50%, which is comparable with the batch devices. The EQE spectra of the two devices are in good agreement and demonstrate that the dots obtained from the flow reactor own good quantum efficiency. FIGS. 1.8A-1.8B illustrates XPS data for Pb and S comparing PbS CQDs made from batch synthesis and dual-stage flow reactor synthesis.

Conclusions

In summary, we obtained high quality PbS colloidal quantum dots (CQDs) with high photoluminescence quantum yield (50%) and narrow full width-half max values. Applying dual-stage in the flow reactor is essential and controllable for synthesis of high quality dots. The solar cell fabricated from the flow-synthesized PbS CQDs achieves on-par performance with the batch synthesized CQDs at a power conversion efficiency of 4.8%. Further work can entail integration of improved passivation strategies of the PbS CQDs surface, such as hybrid passivation, into a more elaborated automated synthesis, with the goal of exceeding the best published performance recently achieved with the benefits of halide passivation processes.[7] In light of the results reported herein, it is clear that the flow reactor approach, with its versatility and rapid screening of multiple parameters, combined with its efficient materials utilization, offers an attractive path to automated synthesis of CQDs for photovoltaics and, more broadly, active optoelectronics.

Methods and Materials

Chemicals. Lead(II) oxide powder (PbO, 99%), oleic acid (OA, technical grade 90%), and bis(trimethylsilyl) sulfide (TMS, 95% purity) were purchased from J. T. Baker, Alpha Aesar, and Acros Organics respectively. 1-Octadecene (ODE, technical grade 90%), acetone (ACS reagent, ≥99.5%), toluene (anhydrous, 99.8%), and octane (anhydrous, ≥99%) were purchased from Sigma-Aldrich. Fluorinert liquid (FC-70 type) was purchased from Fisher Scientific. ODE was degassed by pumping at 100° C. overnight before use, while the other chemicals were used as received without further purification.

PbS CQD Preparation. The conventional batch synthesis of oleic-acid capped PbS CQDs was based on the procedure described by Hines and Scholes using lead oleate and bis(trimethylsilyl) sulfide TMS as precursors.[11] This procedure was adapted in a continuous flow synthesis method using a commercially available continuous flow reactor, the FlowSyn Multi-X system (Uniqsis Ltd, Cambridge UK). The lead oleate precursor was prepared by dissolving lead oxide (PbO, 0.9 g) and oleic acid (OA, 3 mL) in 6 mL 1-octadecene (ODE) and pumping the solution for 16 h at 100° C. Then, 30 mL ODE and 20 mL Fluoroinert FC-70[42] were added to the lead precursor solution. The mixture was transferred to bottle A and maintained at 60° C. to prevent solidification of the precursor. A stock solution of the sulfur precursor (bottle B) was prepared by mixing 360 μl of TMS with 20 mL ODE and 20 mL FC-70 in a glovebox. Both bottles were maintained under continuous vigorous stirring (to maintain a homogenous mixture between the different liquid phases) and nitrogen purging throughout the reaction. The flow rate was typically set within the range 1-3 mL/min. The nucleation temperature was varied in the range of 80-150° C., while the growth temperature was set between 50 and 100° C. After passing through the mixing and thermal stages, the product was collected in vials containing acetone to quench the reaction. The CQDs were washed several times by precipitation with acetone and redispersion in toluene. Finally, the CQDs were redispersed in octane.

Characterization. Linear optical absorption spectra were taken using a Cary UV-Vis-NIR spectrometer (Varian). Glass cuvettes with a path length of 1 mm were used. For measurement purposes, the concentration of the CQD solution was adjusted to 0.4 mg/ml. PLQE measurements were performed at room temperature in air. A 640 nm diode laser with an intensity of approximately 10 W cm$^{-2}$ was used as an excitation source. A NIR spectrometer with an InGaAs array detector (Ocean Optics NIR-512, calibrated using a tungsten halogen lamp as a known source) was connected through fiber optics with an integrating sphere where the sample was positioned. The laser light is directed to enter one of the two ports of the integrating sphere. The second port is connected to an optical fiber to collect direct and indirect excitation mode spectra using the same NIR spectrometer. Low PbS CQD concentrations were used in these measurements to guarantee low reabsorption by the sample of the emitted PL signal. PLQE is calculated by taking the integrated difference between the directly-excited and indirectly-excited photoluminescence photon signals divided by the integrated difference between the direct-pump and indirect-pump laser photon signals. XPS was measured with a Thermo Scientific K-Alpha spectrometer to confirm material composition before and after ligand exchange. A survey measurement was taken first, followed by recording the core level spectra of Pb-4f, S-2p, O-1s, and C-1s with a pass energy of 50 eV. The binding energy was referenced to the C1s hydrocarbon line at 285.0 eV. The curves were fitted using Gaussian functions. Samples made from PbS CQDs were processed for cross-sectional TEM imaging. Zeiss NVision 40 focused ion beam (FIB) mill was used to prepare samples for TEM imaging. Thin films (approximately 100 nm) were prepared with a Ga+ beam followed by argon-ion nano milling. A FEI Titan 80-300 Cubed STEM was used for imaging.

Device Fabrication and Characterization. The PbS CQD film was deposited in a layer-by-layer fashion by spin-casting. PbS CQDs in octane (50 mg/mL) were dispensed on the substrate and spin-cast at 2500 rpm for 10 seconds for each layer. A 1% v/v 3-mercaptopropionic acid (MPA): methanol solution was then dispensed to cover the entire substrate and spun after 3 seconds at the same speed for 5 seconds. Two rinses with methanol were applied for each layer. A top electrode includes of 7.5 nm of MoO3, 50 nm of Au, and 120 nm of Ag was deposited by thermal (MoO3 and Ag) and electron beam (Au) evaporation at a pressure of <1×10$^{-6}$ Torr. The contact size defined by a shadow mask was 0.06 cm$^2$. Optical absorption measurements were carried out in a Cary 500 UV-Vis-IR spectrophotometer using an integrating sphere.

J-V Characterization. AM 1.5 performance measurements were conducted using a class A (<25% spectral mismatch) solar simulator (ScienceTech). The bias sweep was performed using a Keithley 2400 digital multimeter. The source intensity was measured using a Melles-Griot broadband power meter through a circular aperture of 0.049 cm$^2$ and set to be 100 mW cm$^2$. We used an aperture slightly smaller than the top electrode to avoid overestimating the photocurrent: the entire photon fluence passing through the aperture was counted as incident on the device for all analyses of $J_{SC}$ and EQE.[43] The spectral mismatch of the system was characterized using a calibrated reference solar cell (Newport). The total AM1.5 spectral mismatch—taking into account the simulator spectrum and the spectral responsivities of the test cell, reference cell, and broadband power meter was re-measured periodically and found to be ~11%. This multiplicative factor, M=0.89, was applied to the current density values of the J-V curve to most closely resemble true AM 1.5 performance.[44] The test cell was mounted in a thermoelectric cooled holder with temperature feedback. The testing temperature was measured with a thermal couple and stabilized at 25.0±0.1° C. according to the ISO standard. The total accuracy of the AM1.5 power conversion efficiency measurements was estimated to be ±7%.

External Quantum Efficiency (EQE). EQE measurements were generated by a 400 W Xe (Horiba Jobin-Yvon) lamp. The light was passed through a monochromator (Horiba Jobin-Yvon FL-1039), filters (Newport), and an optical chopper operating at 100 Hz coupled to the input of a Stanford Research Systems lock-in amplifier. The collimated light output was measured through a 0.049 cm$^2$ aperture with calibrated Newport 818-UV and Newport 818-IR power meters. The photogenerated current was measured using a lock-in amplifier. The measurement step was 20 nm and the intensity varied with the spectrum of the Xe lamp.

REFERENCES

1. Talapin, D. V.; Lee, J. S.; Kovalenko, M. V.; Shevchenko, E. V. Prospects of Colloidal Nanocrystals for Electronic and Optoelectronic Applications. *Chem. Rev.* 2010, 110, 389-458.
2. Sargent, E. H. Colloidal quantum dot solar cells. *Nat. Photonics* 2012, 6, 133-135.
3. Mitzi, D. B.; Yuana, M.; Liva, W.; Kellock, A. J.; Cheya, S. J.; Gignac, L.; Schrott, A. G. Hydrazine-based deposition route for device-quality CIGS films. *Thin Solid Films,* 2009, 517, 2158-2162.
4. Guo, Q.; Ford G. M.; Agrawal, R.; Hillhouse, H. W. Ink formulation and low-temperature incorporation of sodium to yield 12% efficient Cu(In,Ga)(S,Se)$_2$ solar cells from sulfide nanocrystal inks. *Prog. Photovolt: Res. Appl.* 2013, 21, 64-71.
5. Guo, Q.; Ford G. M.; Yang, W. C.; Walker, B. C.; Stach, E. A.; Hillhouse, H. W.; Agrawal, R. Fabrication of 7.2% Efficient CZTSSe Solar Cells Using CZTS Nanocrystals. *J. Am. Chem. Soc.* 2010, 132, 49, 17384-17386.
6. Ford, G. M.; Guo, Q.; Agrawal, R.; Hillhouse, H. W. Earth Abundant Element Cu$_2$Zn(Sn1-xGex)S-4 Nanocrystals for Tunable Band Gap Solar Cells: 6.8% Efficient Device Fabrication. *Chem. Mater.* 2011, 23, 10, 2626-2629.
7. Ip, A. H.; Thon, S. M.; Hoogland, S.; Voznyy, O.; Zhitomirsky, D.; Debnath, R.; Levina, L.; Rollny, L. R.; Carey, G. H.; Fischer, A.; Kemp, K. W.; Kramer, I. J.; Ning, Z.; Labelle, A. J.; Chou, K. W.; Amassian, A.; Sargent, E. H. Hybrid Passivated Colloidal Quantum Dot Solids. *Nat. Nanotechnol.* 2012, 7, 577-582.
8. Lan, X.; Bai, J.; Masala, S.; Thon, S. M.; Ren, Y.; Kramer, I. J.; Hoogland, S.; Simchi, A.; Koleilat, G. I.; Paz-Soldan, D.; Ning, Z.; Labelle, A. J.; Kim, J. Y.; Jabbour, G.; Sargent, E. H. Self-Assembled, Nanowire Network Electrodes for Depleted Bulk Heterojunction Solar Cells. *Adv. Mater.* 2013, 25, 1769-1773.
9. Ning, Z.; Zhitomirsky, D.; Adinolf i, V.; Sutherland, B.; Xu, J.; Voznyy, O.; Maraghechi, P.; Lan, X.; Hoogland, S.; Ren, Y.; Sargent, E. H. Graded Doping for Enhanced Colloidal Quantum Dot Photovoltaics. *Adv. Mater.* 2013, 25, 1719-1723.
10. Moreels, I.; Justo, Y.; De, G. B.; Haustraete, K.; Martins, J. C.; Hens, Z. Size-Tunable, Bright, and Stable PbS Quantum Dots: A Surface Chemistry Study. *ACS Nano* 2011, 5, 2004-2012.
11. Hines, M. A.; Scholes, G. D. Colloidal PbS nanocrystals with size-tunable near-infrared emission: Observation of post-synthesis self-narrowing of the particle size distribution. *Adv. Mater.* 2003, 15, 1844-1849.
12. Debnath, R.; Bakr, O.; Sargent, E. H. Solution-processed colloidal quantum dot photovoltaics: A perspective. *Energy Environ. Sci.* 2011, 4, 4870-4881.
13. Yang, H.; Luan, W.; Tu, S. T.; Wang, Z. M. Synthesis of nanocrystals via microreaction with temperature gradient: towards separation of nucleation and growth. *Lab Chip* 2008, 8, 451-455.
14. Yen, B. K. H.; Gunther, A.; Schmidt, M. A.; Jensen, K. F.; Bawendi, M. G. A microfabricated gas-liquid segmented flow reactor for high-temperature synthesis: The case of CdSe quantum dots. *Angew. Chem., Int. Ed.* 2005, 44, 5447-5451
15. Yen, B. K. H.; Stott, N. E.; Jensen, K. F.; Bawendi, M. G. A continuous-flow microcapillary reactor for the preparation of a size series of CdSe nanocrystals. *Adv. Mater.* 2003, 15, 1858-1862
16. Marre, S.; Jensen, K. F. Synthesis of micro and nanostructures in microfluidic systems. *Chem. Soc. Rev.* 2010, 39, 1183-1202
17. Nightingale, A. M.; deMello, J. C., Segmented Flow Reactors for Nanocrystal Synthesis. *Adv Mater* 2012, 25, 1813-1821.
18. Edel, J. B.; Fortt, R.; de Mello, J. C.; de Mello, A. J. Microfluidic routes to the controlled production of nanoparticles. *Chem. Commun.* 2002, 1136-1137.
19. Jahn, A.; Reiner, J. E.; Vreeland, W. N.; DeVoe, D. L.; Locascio, L. E.; Gaitan, M. Preparation of nanoparticles by continuous-flow microfluidics. *J. Nanopart. Res.* 2008, 10, 925-934.
20. Boleininger, J.; Kurz, A.; Reuss, V.; Soennichsen, C. Microfluidic continuous flow synthesis of rod-shaped gold and silver nanocrystals. *Phys. Chem. Chem. Phys.* 2006, 8, 3824-3827.
21. Wagner, J.; Koehler, J. M. Continuous Synthesis of Gold Nanoparticles in a Microreactor. *Nano Lett.* 2005, 5, 685-691.
22. Song, Y.; Modrow, H.; Henry, L. L.; Saw, C. K.; Doomes, E. E.; Palshin, V.; Hormes, J.; Kumar, C. S. S. R. Microfluidic Synthesis of Cobalt Nanoparticles. *Chem. Mater.* 2006, 18, 2817-2827.
23. Song, Y.; Kumar, C. S. S. R.; Hormes, J. Synthesis of palladium nanoparticles using a continuous flow polymeric microreactor. *J. Nanosci. Nanotechnol.* 2004, 4, 788-793.
24. Song, Y.; Doomes, E. E.; Prindle, J.; Tittsworth, R.; Hormes, J.; Kumar, C. S. S. R. Investigations into Sulfobetaine-Stabilized Cu Nanoparticle Formation: Toward Development of a Microfluidic Synthesis. *J. Phys. Chem. B* 2005, 109, 9330-9338.
25. Wacker, J. B.; Lignos, I.; Parashar, V. K.; Gijs, M. A. M. Controlled synthesis of fluorescent silica nanoparticles inside microfluidic droplets. *Lab Chip* 2012, 12, 3111-3116
26. Khan, S. A.; Guenther, A.; Schmidt, M. A.; Jensen, K. F. Microfluidic Synthesis of Colloidal Silica. *Langmuir* 2004, 20, 8604-8611.
27. Cottam, B. F.; Krishnadasan, S.; de Mello A. J.; de Mello, J. C.; Shaffer, M. S. P. Accelerated synthesis of titanium oxide nanostructures using microfluidic chips. *Lab Chip* 2007, 7, 167-169.
28. Abou-Hassan, A.; Sandre, O.; Neveu, S.; Cabuil, V. Synthesis of goethite by separation of the nucleation and growth processes of ferrihydrite nanoparticles using microfluidics. *Angew. Chem., Int. Ed.* 2009, 48, 2342-2345
29. Lee, W.-B.; Weng, C.-H.; Cheng, F.-Y.; Yeh, C.-S.; Lei, H.-Y.; Lee, G.-B. Biomedical microdevices synthesis of iron oxide nanoparticles using a microfluidic system. *Biomed. Microdevices* 2009, 11, 161-171.
30. Abou-Hassan, A.; Neveu, S.; Dupuis, V.; Cabuil, V. Synthesis of cobalt ferrite nanoparticles in continuous-flow microreactors. *RSC Adv.* 2012, 2, 11263-11266.
31. Hassan, N.; Cabuil, V.; Abou-Hassan, A. Continuous Multistep Microfluidic Assisted Assembly of Fluorescent, Plasmonic, and Magnetic Nanostructures. *Angew. Chem., Int. Ed.* 2013, 52, 1841.
32. Abdelhady, A. L.; Afzaal, M.; Malik, M. A.; O'Brien, P. Flow reactor synthesis of CdSe, CdS, CdSe/CdS and CdSeS nanoparticles from single molecular precursor(s). *J. Mater. Chem.* 2011, 21, 18768-18775.
33. Shestopalov, I.; Tice, J. D.; Ismagilov, R. F. Multi-step synthesis of nanoparticles performed on millisecond time scale in a microfluidic droplet-based system. *Lab Chip* 2004, 4, 316-321.
34. Chan, E. M.; Alivisatos, A. P.; Mathies, R. A. High-Temperature Microfluidic Synthesis of CdSe Nanocrystals in Nanoliter Droplets. *J. Am. Chem. Soc.* 2005, 127, 13854-13861.
35. Krishnadasan, S.; Tovilla, J.; Vilar, R.; deMello, A. J.; deMello, J. C. On-line analysis of CdSe nanoparticle formation in a continuous flow chip-based microreactor. *J. Mater. Chem.* 2004, 14, 2655-2660.
36. Chan, E. M.; Mathies, R. A.; Alivisatos, A. P. Size-controlled growth of CdSe nanocrystals in microfluidic reactors. *Nano Lett.* 2003, 3, 199-201.
37. Nightingale, A. M.; de Mello, J. C. Controlled Synthesis of III-V Quantum Dots in Microfluidic Reactors. *ChemPhysChem* 2009, 10, 2612-2614.
38. Jin, H.-D.; Chang, C.-H. Continuous synthesis of SnTe nanorods. *J. Mater. Chem.* 2011, 21, 12218-12220.
39. Nightingale, A. M.; de Mello, J. C. Microscale synthesis of quantum dots. *J. Mater. Chem.* 2010, 20, 8454-8463.
40. Burlakov V. M.; Kantorovich, L. Ostwald ripening of binary alloy particles. *J. Chem. Phys.* 2011, 134, 024521.
41. Pattantyus-Abraham, A. G.; Kramer, I. J.; Barkhouse, A. R.; Wang, X. H.; Konstantatos, G.; Debnath, R.; Levina, L.; Raabe, I.; Nazeeruddin, M. K.; Gratzel, M.; et al. Depleted-Heterojunction Colloidal Quantum Dot Solar Cells. *ACS Nano* 2010, 4, 3374-3380.
42. 3M Manufacturing and Industry: Fluoroinert FC-70 product information.
43. Snaith, H. J. The perils of solar cell efficiency measurements. *Nat. Photon.* 2012, 6, 337-340.
44. Kroon, J. M.; Wienk, M. M.; Verhees, W. J. H.; Hummelen, J. C. Accurate efficiency determination and stability studies of conjugated polymer/fullerene solar cells. *Thin Solid Films,* 2002, 223, 403-404.

Example 2

Example 2 describes a use a continuous flow reactor with multiple stages to realize in-line surface passivation. First, we introduce the use of polyfluorinated liquid (e.g., Fluorinert Brand Electronic Liquid) for making the segments to get narrow distribution PbS QDs, in which the Fluorinated liquid's owns unique combination of properties are: high density, high heating transfer, inert reaction media, thermally and chemical stability, and compatibility with sensitive materials. In addition, we divided the nucleation and growth process by using two different coils, whereby we can easily control the QD size. Then, by adding a third stage, we pump the prepared $CdCl_2$ or TBAI precursor into the formed QDs line. With controlled temperature and flow rate, we can get $CdCl_2$ or TBAI passivated QDs with narrower size distribution.

Similar to the batch method, two separate precursors were required. The lead precursor (lead oleate) was prepared by placing under vacuum a mixture of 0.9 g lead oxide (PbO), 3 ml 1-octadecene (ODE) and 6 ml oleic acid (OA) at 100° C. for 16 h. The sulfur precursor was obtained by mixing Bis(trimethylsilyl)sulfide (TMSS) and ODE in the glovebox. Meanwhile, the FC-70 was degassed for 10 h. The two precursors were transferred to a bottle and were mixed with degassed FC-70 under strong stirring. Both the bottles were filled with $N_2$, while bottle B was kept at 60 to prevent solidification. The $CdCl_2$ precursor was prepared by adding 2 mmol (0.256 g) $CdCl_2$, 0.1 g tetradecylphosphonic acid and 10 ml OA to a flask and heating at 100° C. under vacuum for 30 min. TBAI precursor was prepared: 6 mmol (2.21 g) TBAI was dissolved in oleylamine by heating at 200° C. for 2 hours under $N_2$ on a Schlenk line, and then placing under vacuum for 2 hours at 100° C.

Schematic illustration of the experiments is presented in FIG. 2.1. To prepare the narrowing size distribution surface passivated dots with absorption peak around 950 nm, bottle A was filled with 360 μl TMS, 20 ml ODE and 20 ml FC-70, while bottle B was filled with 9 ml lead oleate precursor, 30 ml ODE and 20 ml FC-70. The reagents were pumped to a mixing chip first then passed to the reaction coils to reach the collection vial, where the reaction coil was wound with Teflon or PFA tubing (diameter 1 mm). The first coil with 0.5 ml or longer; temperature was set at 120° C., while the second coil (2 ml) was set at 80° C. The flow rate was optimized to 1.11 ml/min. And the volume ratio A: B was set as 1:1.36. For one sub-reaction, total volume of reagent was 4 ml, pre-collect and post-collect are chosen as minus 2 ml and minus 1 ml in order to selectively collect the steady state fraction. After the second coil, the $CdCl_2$ or TBAI precursor was pumped in the line channel and mixed with formed quantum dots. After it goes through one small coil (0.2 ml), the product was collected in a vial filled with 10 ml acetone in the fraction collector. The sample was centrifuged, washed with toluene and acetone twice, and re-dissolved in toluene. FIG. 2.2 shows the comparison of three different samples: unpassivated dots, $CdCl_2$ passivated dots and TBAI passivated dots. The passivated dots have a red shift of the aborption peak, which means the original dots surface was successfully passivated. And the peak to valley ratio of the three samples is almost the same, which means similar size distribution.

Example 3

Different sizes of CQDs can be realized by varying the reaction temperature. Pb-Oleate precursor was prepared by mixing Pb-oleate (9 mL) and octadecene (10 mL). The sulfur precursor was prepared by mixing 630 μl bis(trimethylsilyl) sulfide and 24 mL octadecene. The ratio of Pb and S precursor is consistent as 1:1.5. Total 2 ml precursor was used for each reaction, while residence time is the same (96 second). Octadecene (ODE) was used as the pumping solvent. Four different temperatures were used as the reaction temperature: 80° C., 100° C., 120° C. and 140° C. After purification, the final products were characterized by ultraviolet visible spectrometer, and absorption peaks ranged from 991 nm to 1390 nm.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'".

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

What is claimed:

1. A system for making a quantum dot (QD), comprising:
   a mixing device for receiving solution A and solution B, wherein the mixing device is configured to mix solution A and solution B to form solution C;
   a first coil in fluidic communication with the mixing device, wherein the first coil is configured to form QD seeds from solution C via nucleation and is connected to a first thermocouple configured for a first temperature; and
   a second coil positioned in serial communication with the first coil, wherein the second coil is in fluidic communication with the first coil and directly attached to the first coil, wherein the second coil is configured to grow the QDs from the QD seeds and is connected to a second thermocouple configured for a second temperature, wherein the second temperature is lower than the first temperature,
   wherein the first coil and the second coil are independent of one another.

2. The system of claim 1, wherein the system is a continuous flow process system.

3. The system of claim 1, wherein the mixing device is one or more of a mixing chip or heating column.

4. The system of claim 1, wherein the first temperature is about 110 to 130° C.

5. The system of claim 1, wherein the second temperature is about 70 to 90° C.

6. The system of claim 1, further comprising one or more containers in fluidic communication with the mixing device.

7. The system of claim 1, further comprising:
   an introduction port positioned after the second coil to introduce a solution to the QDs; and
   a third coil positioned in serial communication with the second coil, wherein the first coil, the second coil, and the third coil are independent of one another.

8. The system of claim 7, wherein the injection port is configured to introduce $CdCl_2$ TBAI, CO, tetrabutylammonium bromide, tetrabutylammonium chloride, inorganic halides, pseudohalides, halometallate ligands, or a combination thereof.

9. The system of claim 7, wherein the third coil is configured to passivate the QDs.

10. The system of claim 7, wherein the third coil is operated at a third temperature.

11. The system of claim 7, wherein one or more of the first coil, second coil, and third coil are made of one or more of Teflon, PFA, PTFE, FEP, PVDF, and ETFE.

12. The system of claim 1, further comprising a collection device for collecting QDs.

13. The system of claim 12, wherein the collection device is configured to one or more of separate, rinse, and wash QDs.

14. The system of claim 1, wherein one or more of temperature and residence time may be adjusted to vary a size of QDs.

15. The system of claim 7, wherein the second coil is longer than the first coil and the third coil is shorter than the first coil.

16. The system of claim 1, wherein solution C comprises a solution of QD precursors and an inert immiscible fluid and the mixing device is configured to segment flow of the QD precursors into droplets of the solution within the inert immiscible fluid.

17. The system of claim 16, wherein one or more of solution A and solution B include a fluorinated fluid in the inert immiscible fluid.

18. The system of claim 17, wherein the fluorinated fluid is one or more of $C_{15}F_{33}N$, $C_{18}H_{39}N$, FC-70, FC-71, and FC-770.

19. The system of claim 10, wherein the third temperature is about 30 to about 70° C.

20. The system of claim 10, wherein each of the first temperature, second temperature, and third temperature are different.

* * * * *